(12) United States Patent
Jordan et al.

(10) Patent No.: US 12,730,771 B2
(45) Date of Patent: Sep. 8, 2026

(54) CONTROLLER AREA NETWORK (CAN) BUS DRIVER USING TRANSLINEAR LOOPS

(71) Applicant: Microchip Technology Incorporated, Chandler, AZ (US)

(72) Inventors: Declan Jordan, Skerries (IE); David Gammie, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 65 days.

(21) Appl. No.: 18/977,300

(22) Filed: Dec. 11, 2024

(65) Prior Publication Data

US 2025/0190389 A1 Jun. 12, 2025

Related U.S. Application Data

(60) Provisional application No. 63/609,088, filed on Dec. 12, 2023.

(51) Int. Cl.

*G06F 13/40* (2006.01)
*H03K 17/60* (2006.01)
*H03K 17/687* (2006.01)

(52) U.S. Cl.

CPC ......... *G06F 13/4072* (2013.01); *H03K 17/60* (2013.01); *H03K 17/6871* (2013.01)

(58) Field of Classification Search

None
See application file for complete search history.

(56) References Cited

U.S. PATENT DOCUMENTS

| | | | | |
|---|---|---|---|---|
| 11,310,075 | B2 * | 4/2022 | Chang | H04L 7/0008 |
| 2014/0376599 | A1 | 12/2014 | Xi et al. | |
| 2024/0187533 | A1 * | 6/2024 | Chou | H04M 19/026 |
| 2025/0240184 | A1 * | 7/2025 | Jordan | H04L 12/10 |

FOREIGN PATENT DOCUMENTS

WO 2023283181 A1 1/2023

OTHER PUBLICATIONS

International Search Report & Written Opinion issued on Feb. 24, 2025, in corresponding International Application No. PCT/US2024/059675 (11 pages).

He Mingze et al, "A high-Speed CAN Bus Transmitter with Low Electromagnetic Emission", 2022 7th International Conference on Integrated Circuits and Microsystems (ICICM), IEEE, Oct. 28, 2022 (Oct. 28, 2022), p. 676-681.

* cited by examiner

*Primary Examiner* — Jany Richardson

(74) *Attorney, Agent, or Firm* — Shumaker, Loop & Kendrick, LLP; Ryan M. Corbett

(57) ABSTRACT

A Controller Area Network (CAN) bus driver for driving a CAN bus is provided. The bus driver may include a first translinear loop circuit to receive an input voltage and output a first output current signal corresponding to an exponential function, a second translinear loop circuit to receive the input voltage and output a second output current signal corresponding to a hyperbolic function, a divider circuit to output a divided output current signal corresponding to the first output current signal divided by the second output current signal, a CAN Lo driver circuit to output the divided output current signal to a CAN Lo wire of the CAN bus, and a CAN Hi driver circuit to output the divided output current signal to a CAN Hi wire of the CAN bus.

21 Claims, 7 Drawing Sheets

CONTROLLER AREA NETWORK (CAN) BUS DRIVER USING TRANSLINEAR LOOPS

CROSS-REFERENCE TO RELATED APPLICATION

The present application claims priority to U.S. Provisional Patent Application No. 63/609,088, entitled: Controller Area Network (CAN) Bus Driver Using Translinear Loops, filed on Dec. 12, 2023, the contents of which are hereby incorporated by reference in their entirety.

TECHNICAL FIELD

The present disclosure relates generally to driver circuitry for a Controller Area Network (CAN) bus, and more specifically to a CAN bus driver that uses translinear loops to inject current into the CAN bus.

SUMMARY

According to an aspect of one or more examples, there is provided a CAN bus driver for driving a CAN bus. The CAN bus driver may include a first translinear loop circuit to receive an input voltage and output a first output current signal corresponding to an exponential function, a second translinear loop circuit to receive the input voltage and output a second output current signal corresponding to a hyperbolic function, a divider circuit to output a divided output current signal corresponding to the first output current signal divided by the second output current signal, a CAN Lo driver circuit to output the divided output current signal to a CAN Lo wire of the CAN bus, and a CAN Hi driver circuit to output the divided output current signal to a CAN Hi wire of the CAN bus. The exponential function may be $e^x$ and the hyperbolic function may be cosh(x). The divider circuit may be a stacked NPN translinear divider circuit. The input voltage may be a linear ramp voltage.

The first translinear loop circuit may include a first field effect transistor, a second field effect transistor, a current source configured to provide a first current, and a capacitor configured to receive a second current. A gate terminal of the first field effect transistor may be coupled to a gate terminal of the second field effect transistor, and a drain terminal of the first field effect transistor may be coupled to the current source that is configured to provide the first current, and to the gate terminal of the first field effect transistor. A source terminal of the first field effect transistor may be coupled to the current source that is configured to provide the first current, may be configured to receive the input voltage, and may be coupled to the capacitor that is configured to receive the second current. A source terminal of the second field effect transistor may be coupled to a bias voltage. The input voltage may be a linear ramp voltage and the first translinear loop circuit may be configured to map the linear ramp voltage to an exponential current in a drain terminal of the second field effect transistor.

The first translinear loop circuit may include a first field effect transistor, a second field effect transistor, a third field effect transistor, a fourth field effect transistor, a fifth field effect transistor, a sixth field effect transistor, a voltage source, and a current source configured to provide a current. A gate terminal of the third field effect transistor may be configured to receive the input voltage, and a voltage at a gate terminal of the third field effect transistor may be ramped down by the voltage source. The gate terminal of the third field effect transistor may be coupled to a gate terminal of the first field effect transistor, and a drain terminal of the third field effect transistor may be coupled to the current source that is configured to provide the current. A drain current of the first field effect transistor may be exponentially related to a voltage swing at the gate terminal of the third field effect transistor, and the drain current of the first field effect transistor may be mirrored by the sixth field effect transistor to output the first output current signal. The second, fourth, and fifth field effect transistors may be source followers.

The second translinear loop circuit may include a first field effect transistor, a second field effect transistor, a third field effect transistor, a fourth field effect transistor, a fifth field effect transistor, a sixth field effect transistor, a seventh field effect transistor, an eighth field effect transistor, a ninth field effect transistor, and a first current source configured to provide a first current. A drain terminal of a first field effect transistor may be configured to receive the input voltage, to generate a positive drain current of the first field effect transistor. The drain terminal of the first field effect transistor may be coupled to a drain terminal of the second field effect transistor, which results in a negative drain current of the second field effect transistor. A gate terminal of the third field effect transistor may be coupled to the gate terminal of the second field effect transistor to form a current mirror that is configured to mirror the negative drain current to a drain terminal of the third field effect transistor, and may be coupled to a drain terminal of the fourth field effect transistor. The second and third field effect transistors may be p-type field effect transistors, and the first, fourth, fifth, sixth, seventh, eighth, and ninth field effect transistors may be n-type field effect transistors. Gate terminals of the fourth, fifth, and sixth field effect transistors may be configured to receive a bias voltage, and gate terminals of the first, seventh, and eighth field effect transistors may be configured to receive the input voltage. The CAN bus driver may also include a second current source configured to supply a second current, which corresponds to drain currents of the fifth field effect transistor and the seventh field effect transistor, and a third current source configured to supply a third current to a drain terminal of the sixth field effect transistor. Source terminals of the first, fourth, sixth, seventh, and eighth field effect transistors may be coupled to ground or common mode via the ninth field effect transistor.

The second translinear loop circuit may include a first field effect transistor, a second field effect transistor, a third field effect transistor, a fourth field effect transistor, a fifth field effect transistor, a sixth field effect transistor, a seventh field effect transistor, and an eighth field effect transistor. A gate terminal of the first field effect transistor may be coupled to gate terminals of the third and fourth field effect transistors, a gate terminal of the fifth field effect transistor may be coupled to a gate terminal of the second field effect transistor and a drain terminal of the sixth field effect transistor. A gate terminal of the sixth field effect transistor may be configured to receive a bias voltage, and may be coupled to gate terminals of the seventh and eighth field effect transistors, and a drain terminal of the eighth field effect transistor may be coupled to an output to output the second output current signal.

The divider circuit may include four bi-polar junction transistors (BJTs). The CAN Lo driver circuit may include a first field effect transistor configured to receive the divided output current signal, second and third field effect transistors configured to receive mirrors of the divided output current signal, and fourth, fifth, sixth and seventh field effect transistors configured to output the divided output current signal to a CAN Lo wire of the CAN bus. The CAN Hi driver circuit may include first and second field effect transistors configured to receive the divided output current signal, and third, fourth, fifth, and sixth field effect transistors configured to amplify and output the divided output current signal to a CAN Hi wire of the CAN bus.

According to an aspect of one or more examples, there is provided a method for driving a Controller Area Network (CAN) bus. The method may include receiving an input voltage and outputting a first output current signal corresponding to an exponential function using a first translinear loop circuit, receiving the input voltage and outputting a second output current signal corresponding to a hyperbolic function using a second translinear loop circuit, outputting a divided output current signal corresponding to the first output current signal divided by the second output current signal using a divider circuit, outputting the divided output current signal to a CAN Lo wire of the CAN bus using a CAN Lo driver circuit, and outputting the divided output current signal to a CAN Hi wire of the CAN bus using a CAN Hi driver circuit. The exponential function may be $e^x$ and the hyperbolic function may be cosh(x).

DETAILED DESCRIPTION OF VARIOUS EXAMPLES

Figure 1:
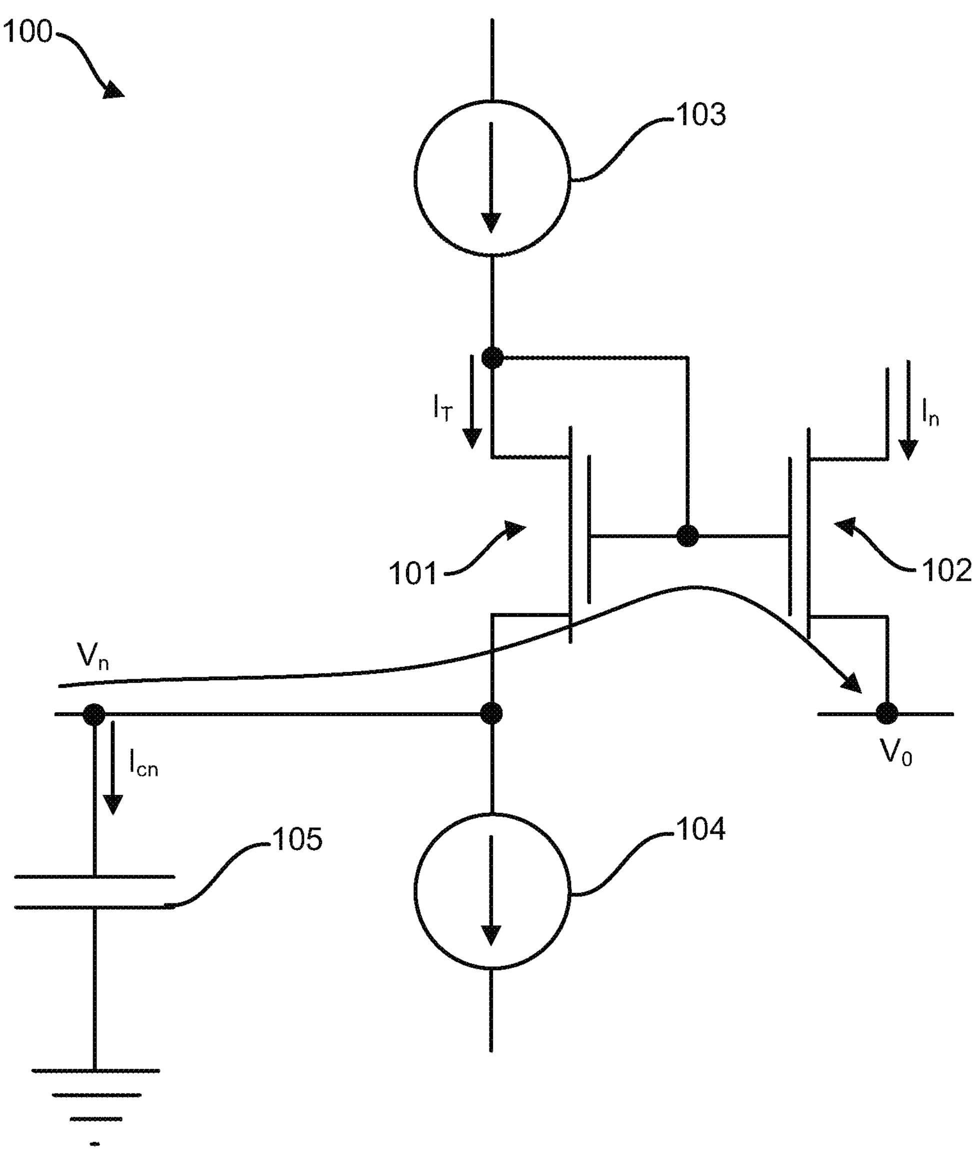
FIG. 1 shows a circuit diagram of a translinear loop circuit according to one or more examples for generating a current signal corresponding to $e^x$.

Reference will now be made in detail to the following various examples, which are illustrated in the accompanying drawings, wherein like reference numerals refer to like elements throughout. The following examples may be embodied in various forms without being limited to the examples set forth herein.

CAN buses are used in a variety of applications to allow multiple devices to communicate with each other using a common bus. Perhaps the most common use of CAN buses is in automobiles to allow various controllers, processors, sensors, and other devices to transmit and receive information using a single bus. A CAN bus is made of two wires, a CAN Low (CANL) wire and a CAN High (CANH) wire, and a differential signal is created between the two wires. Current signals that are supplied to the CAN bus must meet certain waveform standards. One way of supplying current to the CAN bus is to quantize an analog current signal, and inject the quantized current signal to the CAN bus. However, quantizing the analog current signal requires complex timing circuitry to drive current into the CAN bus, and requires a large die size to implement. As data rates increase, the timing circuitry becomes more complex, so this approach does not scale well at higher data rates. Moreover, the quantization step results in a sharp step signal that may be susceptible to electromagnetic interference (EMI). Therefore, there is a need for a CAN driver circuit that may address one or more of these issues.

According to an aspect of one or more examples, there is provided a CAN bus driver that may generate a mathematically smooth waveform that may reduce EMI, reduce complexity and die size, and may scale at higher data rates. FIG. 1 shows a circuit diagram of a translinear loop circuit 100 according to one or more examples for generating a current signal corresponding to $e^x$. According to one or more examples, the translinear loop circuit 100 generates a current signal corresponding to an exponential function. For example, the current signal may correspond to $x^2$. According to one or more examples, the current signal may correspond to a series expansion to approximate $e^x$ or any other exponential function. The translinear loop circuit 100 of FIG. 1, may include two field effect transistors (FETs) 101, 102 that have their respective gate terminals coupled together. The drain terminal of the first FET 101 is coupled to a current source 103 that provides a current $I_T$, and is also coupled to the gate terminal of the first FET 101 and gate terminal of the second FET 102. The source terminal of the first FET 101 is coupled to a current source 104 that provides the same current $I_T$. The source terminal of the first FET 101 also receives an input voltage $V_n$, and is coupled to a capacitor 105 that receives a current $I_{en}$. The source terminal of the second FET 102 is coupled to a bias voltage $V_0$. According to one or more examples, the input voltage $V_n$ may be a linear ramp voltage that may be received from, for example, from a microcontroller coupled to a CAN bus. The translinear loop circuit 100 of FIG. 1 may map the linear input voltage to an exponential current $I_n$ in the drain terminal of the second FET 102, which may be determined according to the following Equation (1):

$$I_n = I_T e^{(V_n - V_0)/U_T} \quad (1)$$

Figure 2:
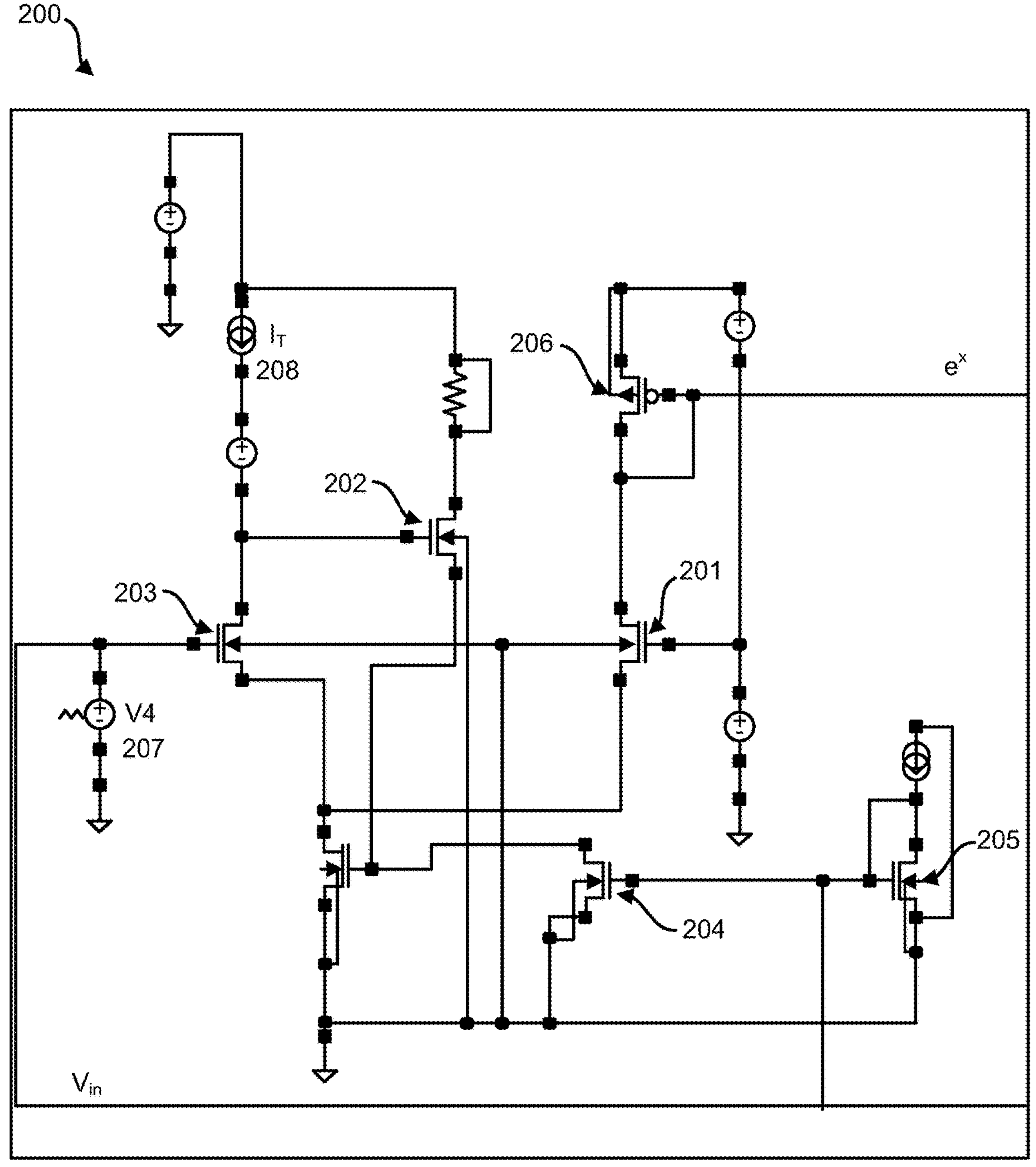
FIG. 2 shows a circuit diagram of a translinear loop circuit according to one or more examples for generating a current signal corresponding to $e^x$.

FIG. 2 shows a circuit diagram of a translinear loop circuit 200 according to one or more examples for generating a current signal corresponding to $e^x$. As shown in FIG. 2, the translinear loop circuit 200 may include, among other components, a first FET 201, a second FET 202, a third FET 203, a fourth FET 204, a fifth FET 205, a sixth FET 206, a voltage source V4 207, and a current source 208 configured to provide a current $I_T$. The third FET 203 may receive at its gate terminal an input voltage Vin, which may be provided, for example, by a microcontroller coupled to the CAN bus. The voltage at the gate terminal of the third FET 203 may be ramped from, for example, 2.12V to 1.88V by the voltage source V4 207. The gate terminal of the third FET 203 may be coupled to the gate terminal of the first FET 201, and the drain terminal of the third FET 203 may be coupled to the current source 208 configured to provide the current $I_T$. Similar to the circuit 100 of FIG. 1, the drain current of the first FET 201 may be exponentially related to the voltage swing at the gate terminal of the third FET 203, according to Equation (1) above. The exponential drain current of the first FET 201 may be mirrored by the sixth FET 206, to output a first output current signal corresponding to $e^x$ to a divider circuit (e.g., divider circuit 500 of FIG. 5) that will be explained below. The second, fourth, and fifth FETs 202, 204, and 205 may be source followers that may improve performance. According to one or more examples, the translinear loop circuit 200 may generate a current signal corresponding to an exponential function. For example, the current signal may correspond to $x^2$. According to one or more examples, the current signal may correspond to a series expansion to approximate $e^x$ or any other exponential function.

Figure 3:
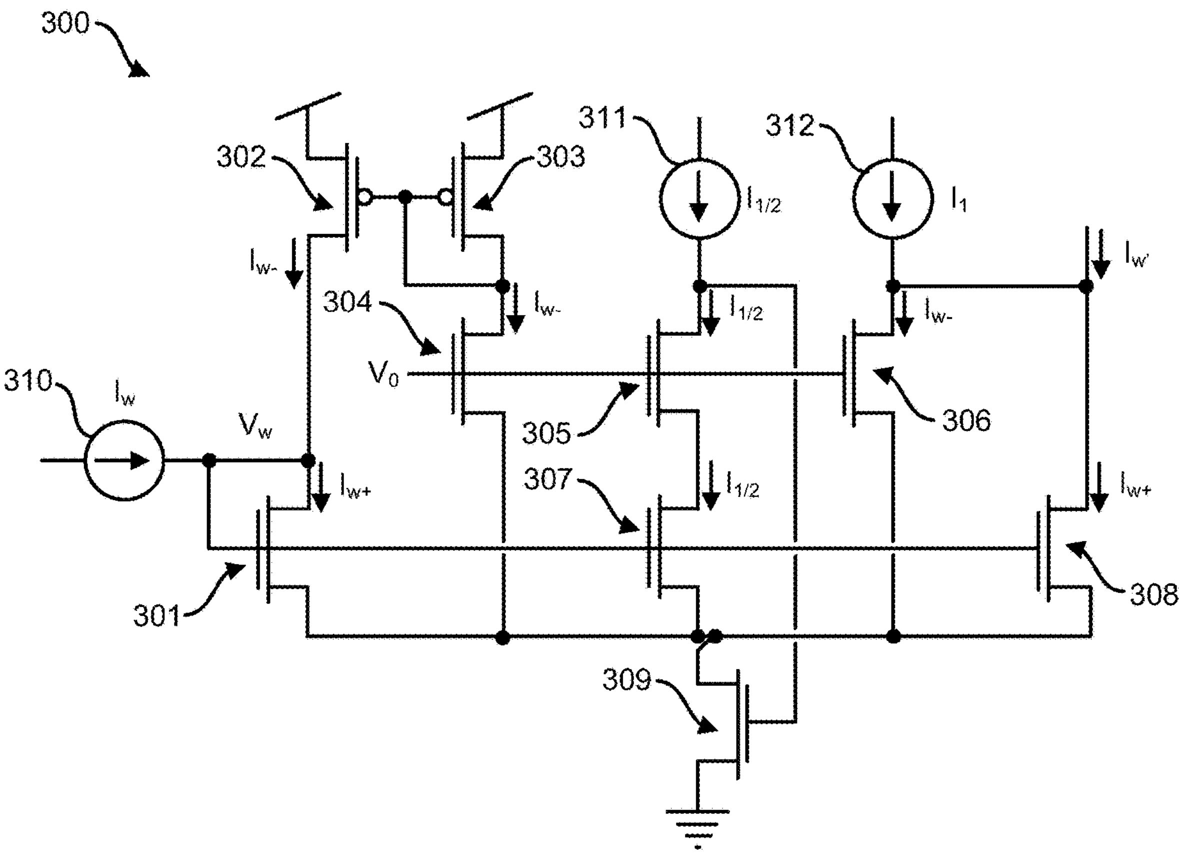
FIG. 3 shows a circuit diagram of a translinear loop circuit according to one or more examples for generating a current signal corresponding to cosh(x).

FIG. 3 shows a circuit diagram of a translinear loop circuit 300 according to one or more examples for generating a current signal corresponding to cosh(x). As shown in FIG. 3, the translinear loop circuit 300 may include, among other components, a first FET 301, a second FET 302, a third FET 303, a fourth FET 304, a fifth FET 305, a sixth FET 306, a seventh FET 307, an eighth FET 308, a ninth FET 309, and a first current source 310 configured to provide an input current $I_w$. A linear input voltage $V_w$ may be provided, for example, by a microcontroller coupled to the CAN bus, and the input current $I_w$ may be provided, for example, by the first current source 310 as shown in FIG. 3. The input voltage $V_w$ may be applied to the drain terminal of the first FET 301, which results in a drain current $I_{w+}$ of the first FET 301 that is determined according to the following Equation (2):

$$w_+ \equiv \frac{I_{w+}}{I_1} = \frac{1}{2}\left(1 + e^{\kappa(V_w - V_0)/U_T}\right), \tag{2}$$

where $I_1$ is the current supplied to the drain terminal of the sixth FET 306 (described below), $V_0$ is a bias voltage, and Ur is the thermal voltage.

The drain terminal of the first FET 301 may be coupled to the drain terminal of the second FET 302, which results in a drain current $I_{w-}$ of the second FET 302 that is determined according to the following Equation (3):

$$w_- \equiv \frac{I_{w-}}{I_1} = \frac{1}{2}\left(1 + e^{-\kappa(V_w - V_0)/U_T}\right). \tag{3}$$

The gate terminal of the third FET 303 may be coupled to the gate terminal of the second FET 302 to form a current mirror that mirrors the current $I_{w-}$ to the drain terminal of the third FET 303, which is coupled to the drain terminal of the fourth FET 304. As shown in FIG. 3, the second and third FETs 302 and 303 may be p-type FETs, while the remaining FETs (e.g., first FET 301, fourth FET 304, fifth FET 305, sixth FET 306, seventh FET 307, eighth FET 308, and ninth FET 309) may be n-type FETs. The bias voltage $V_0$ may be applied to the gate terminals of the fourth, fifth, and sixth FETs 304, 305, and 306. The input voltage $V_w$ may be applied to the gate terminals of first, seventh, and eighth FETs 301, 307, and 308. A second current source 311 may supply a current $I_{1/2}$, which corresponds to the drain currents of the fifth and seventh FETs 305 and 307. A third current source 312 may provide the current $I_1$ to the drain terminal of the sixth FET 306. The source terminals of the first, fourth, sixth, seventh, and eighth FETs 301, 304, 306, 307, and 308 may be coupled to a ground or common node via the ninth FET 309.

The input current $I_w$ can be represented by the following Equation (4):

$$w \equiv \frac{I_w}{I_1} = w_+ - w_-. \tag{4}$$

Substituting Equations (2) and (3) into Equation (4), the input current $I_w$ can be represented according to the following Equation (5):

$$\frac{I_w}{I_1} = \sinh\frac{\kappa(V_w - V_0)}{U_T} \tag{5}$$

The current $I_{w'}$ received at the node coupled to the drain terminals of the sixth and eighth FETs 306 and 308 is represented by the following Equation (6):

$$w' \equiv \frac{I_{w'}}{I_1} = w_+ + w_- - 1 = \cosh\frac{\kappa(V_w - V_0)}{U_T} \tag{6}$$

Therefore, as shown by Equation (6), the current $I_{w'}$ is proportional to the hyperbolic cosine of the input voltage $V_w$.

According to one or more examples, the translinear loop circuit 300 may generate a current signal corresponding to a hyperbolic function. According to one or more examples, the current signal may correspond to a series expansion to approximate cosh(x) or any other hyperbolic function.

Figure 4:
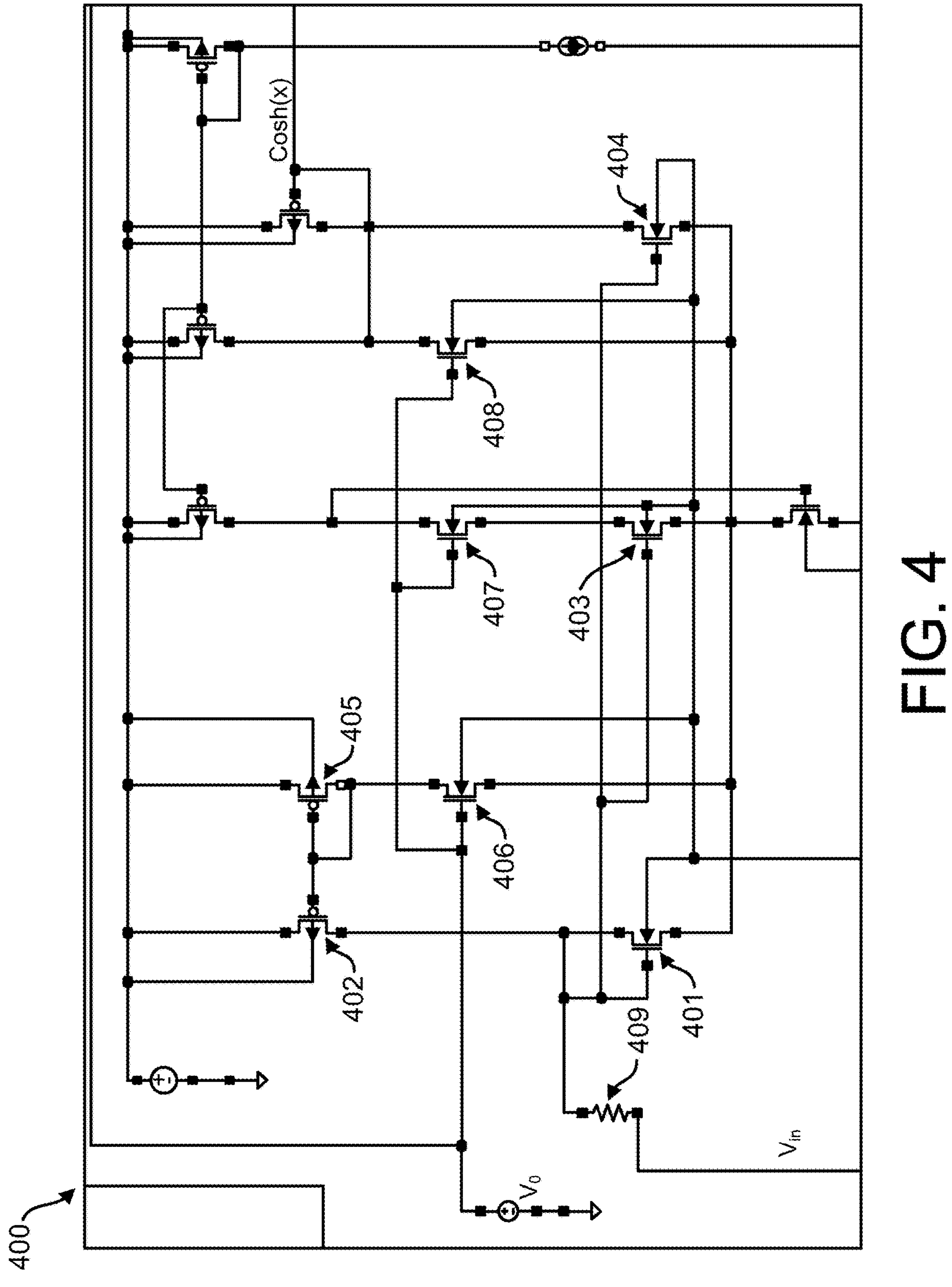
FIG. 4 shows a circuit diagram of a translinear loop circuit according to one or more examples for generating a current signal corresponding to cosh(x).

FIG. 4 shows a circuit diagram of a translinear loop circuit 400 according to one or more examples for generating a current signal corresponding to cosh(x). As shown in FIG. 4, the translinear loop circuit 400 may include, among other components, a first FET 401, a second FET 402, a third FET 403, a fourth FET 404, a fifth FET 405, a sixth FET 406, a seventh FET 407, and an eighth FET 408. An input voltage Vin, which may be provided, for example, by a microcontroller coupled to the CAN bus, may be coupled to a resistor 409 to generate a current signal that is provided to the gate terminal of the first FET 401, and the drain terminal of the second FET 402. Similar to the configuration shown in FIG. 3, the gate terminal of the first FET 401 may be coupled to the gate terminals of third and fourth FETs 403 and 404. The gate terminal of the fifth FET 405 may be coupled to the gate terminal of the second FET 402 to mirror the drain current of the second FET 402 to the drain terminal of the fifth FET 405, which is be coupled to the drain terminal of the sixth FET 406. The gate terminal of the sixth FET 406 may be configured to receive a bias voltage $V_0$, and may be coupled to the gate terminals of the seventh and eighth FETs 407 and 408. As explained above in connection with Equations (2) through (6), the drain terminal of the eighth FET 408 may be coupled to an output that outputs a second output current signal corresponding to cosh(x). According to one or more examples, the translinear loop circuit 400 may generate a current signal corresponding to a hyperbolic function. According to one or more examples, the current signal may correspond to a series expansion to approximate cosh(x) or any other hyperbolic function.

Figure 5:
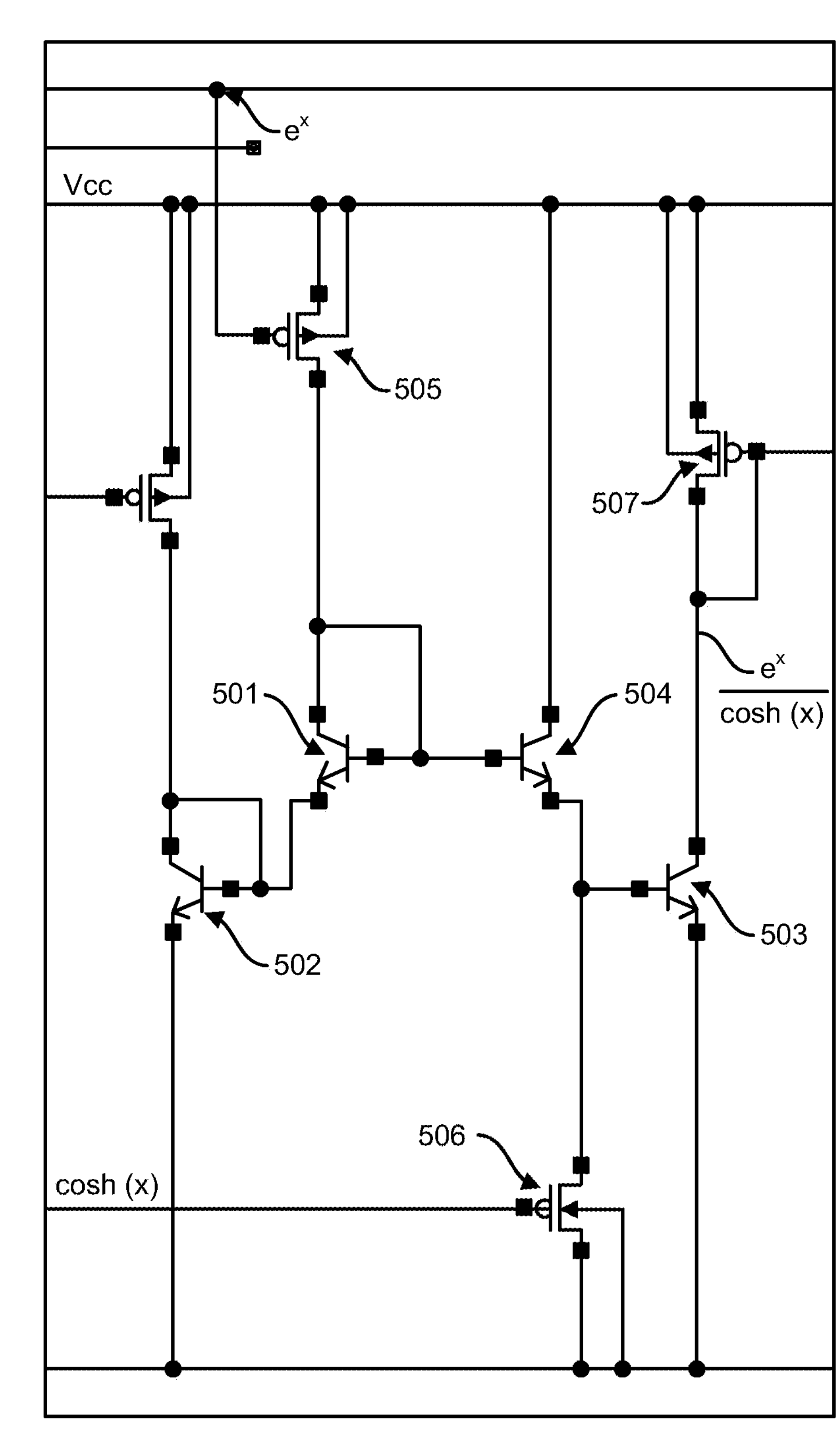
FIG. 5 shows a divider circuit according to one or more examples for dividing a current signal corresponding to $e^x$ by a current signal corresponding to cosh(x).

FIG. 5 shows a divider circuit 500 according to one or more examples for dividing a current signal corresponding to $e^x$ by a current signal corresponding to cosh(x). For example, the divider circuit 500 may be a stacked NPN translinear divider circuit that may include four bi-polar junction transistors (BJTs) 501, 502, 503, and 504, as shown in FIG. 5, although other divider circuits may be used. The divider circuit 500 receives the first output current signal corresponding to $e^x$ that is generated by the first translinear loop circuit (e.g., the translinear loop circuit 100 of FIG. 1 or the translinear loop circuit 200 of FIG. 2). For example, the first output current signal corresponding to $e^x$ may be coupled to the gate terminal of a first FET 505. The divider circuit 500 may also receive the second output current signal corresponding to cosh(x) that is generated by the second translinear loop circuit (e.g., the translinear loop circuit 300 of FIG. 3 or the translinear loop circuit 400 of FIG. 4). For example, the second output current signal corresponding to cosh(x) may be coupled to the gate terminal of a second FET 506, the drain terminal of which is coupled to the base terminal of BJT 503 and the emitter terminal of BJT 504. The current signal at the collector terminal of BJT 503 is a divided output current signal that corresponds to the current signal corresponding to $e^x$ divided by the current signal corresponding to cosh(x). The divided output current signal is mirrored to CANL and CANH drivers by a third FET 507, as explained below in FIGS. 6 and 7.

Figure 6:
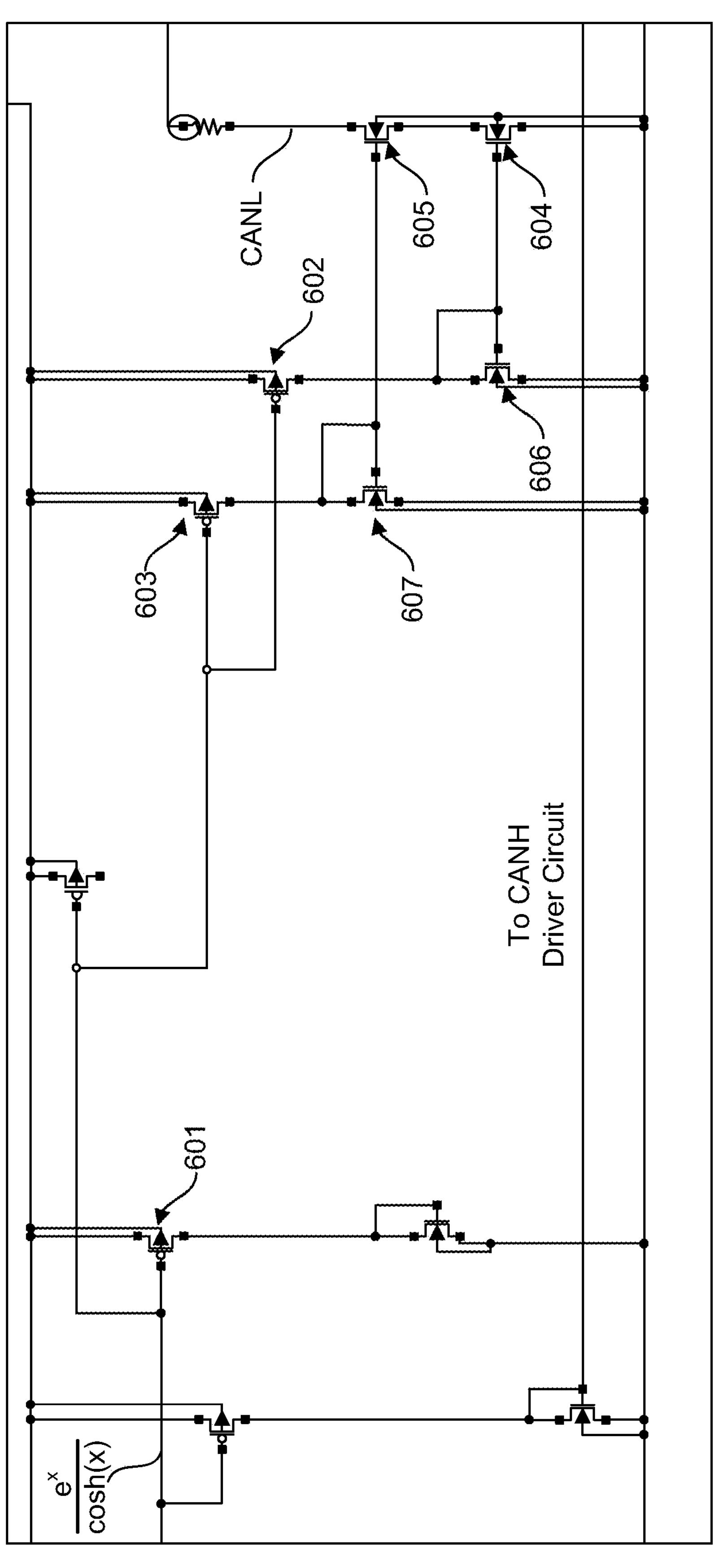
FIG. 6 shows a circuit diagram of a CANL driver circuit according to one or more examples.

FIG. 6 shows a circuit diagram of a CANL driver circuit 600 according to one or more examples. As shown in FIG. 6, the CANL driver circuit 600 may include, among other components, a first FET 601, a second FET 602, a third FET 603, a fourth FET 604, a fifth FET 605, a sixth FET 606, and a seventh FET 607. The first FET 601 may receive the divided output current signal that corresponds to the current signal corresponding to $e^x$ divided by the current signal corresponding to cosh(x), which is provided by the divider circuit 500 of FIG. 5. The divided output current signal may be mirrored to the second and third FETs 602 and 603, which is output to the CANL wire of the CAN bus via the fourth, fifth, sixth, and seventh FETs 604, 605, 606, and 607.

Figure 7:
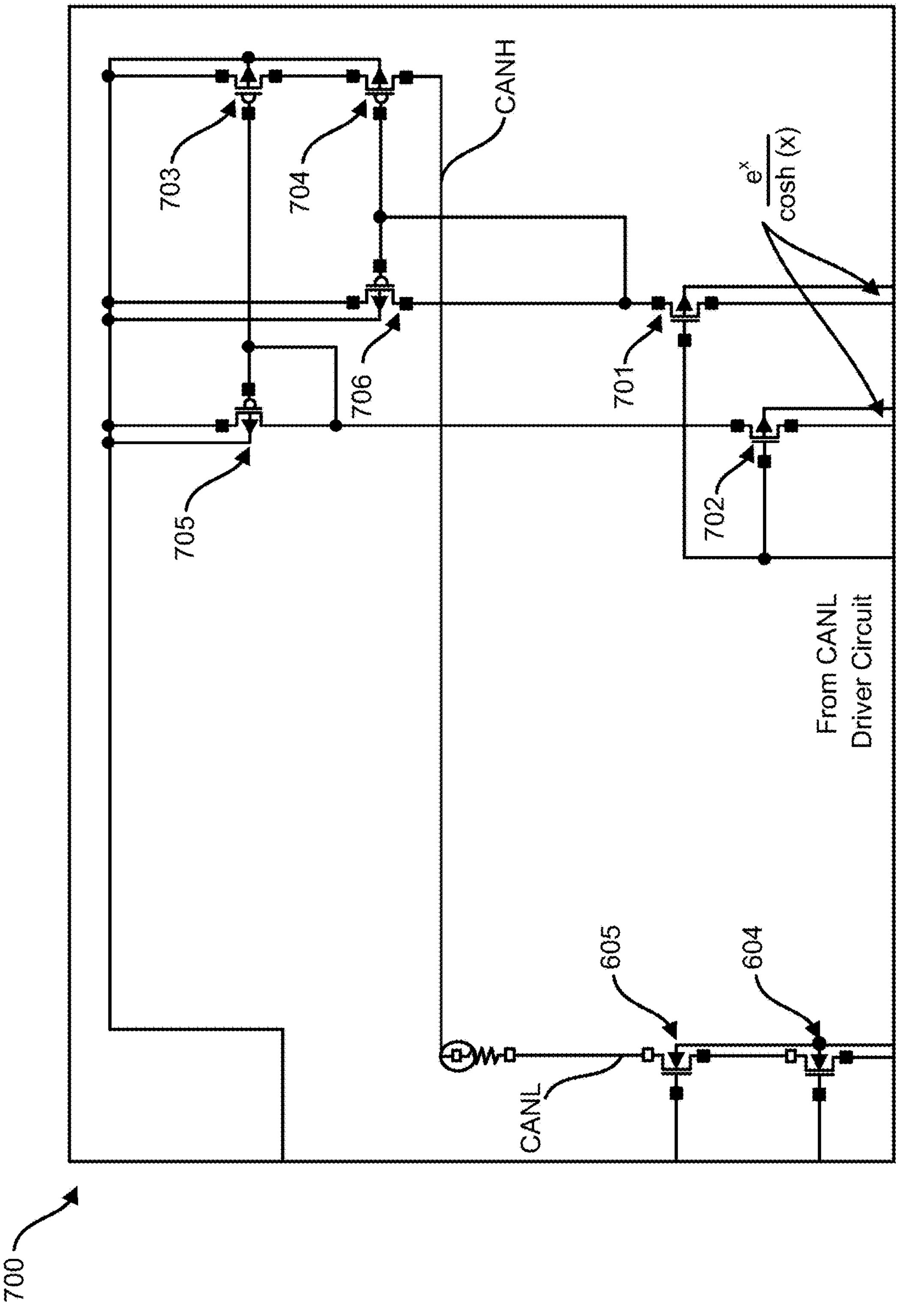
FIG. 7 shows a circuit diagram of a CANH driver circuit according to one or more examples.

FIG. 7 shows a circuit diagram of a CANH driver circuit 700 according to one or more examples. As shown in FIG. 7, the CANH driver circuit 700 may include, among other components, a first FET 701, a second FET 702, a third FET 703, a fourth FET 704, a fifth FET 705, and a sixth FET 706. The first and second FETs 701 and 702 may be configured to receive the divided output current signal that corresponds to the current signal corresponding to $e^x$ divided by the current signal corresponding to cosh(x), which is provided by the divider circuit 500 of FIG. 5. The divided output current signal may be amplified by the third, fourth, fifth, and sixth FETs 703, 704, 705, and 706 and output to the CANH wire of the CAN bus. The gate terminals of the first and second FETs 701 and 702 may be coupled to the CANL driver circuit 600 of FIG. 6.

By using the divided output current signal that corresponds to the current signal corresponding to $e^x$ divided by the current signal corresponding to cosh(x), the CAN bus may be driven using a smooth step function, as compared to a sharp step signal that results from quantizing the analog current signal, which may result in less susceptibility to EMI. In addition, by using the translinear loop circuits (e.g., translinear loop circuit 100 in FIG. 1, translinear loop circuit 200 in FIG. 2, translinear loop circuit 300 in FIG. 3, or translinear loop circuit 400 in FIG. 4) to generate the CAN bus driver signals, the complex timing circuitry needed to implement a quantized step signal may be avoided or reduced, which may reduce the size of the die needed to implement the CAN Bus driver circuit and allow for greater scalability.

Various examples have been disclosed herein, in connection with the above description and the drawings. It will be understood that it would be unduly repetitious to literally describe and illustrate every combination and subcombination of these examples. Accordingly, all examples can be combined in any way or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A Controller Area Network (CAN) bus driver for driving a CAN bus, the CAN bus driver comprising:

a first translinear loop circuit to receive an input voltage and output a first output current signal corresponding to an exponential function;

a second translinear loop circuit to receive the input voltage and output a second output current signal corresponding to a hyperbolic function;

a divider circuit to output a divided output current signal corresponding to the first output current signal divided by the second output current signal;

a CAN Lo driver circuit to output the divided output current signal to a CAN Lo wire of the CAN bus; and a CAN Hi driver circuit to output the divided output current signal to a CAN Hi wire of the CAN bus.

2. The CAN bus driver of claim 1, wherein the exponential function is $e^x$ and the hyperbolic function is cosh(x).

3. The CAN bus driver of claim 1, wherein the divider circuit is a stacked NPN translinear divider circuit.

4. The CAN bus driver of claim 1, wherein the input voltage is a linear ramp voltage.

5. The CAN bus driver of claim 1, wherein the first translinear loop circuit comprises a first field effect transistor, a second field effect transistor, a current source configured to provide a first current, and a capacitor configured to receive a second current, and wherein a gate terminal of the first field effect transistor is coupled to a gate terminal of the second field effect transistor, and a drain terminal of the first field effect transistor is coupled to the current source that is configured to provide the first current, and to the gate terminal of the first field effect transistor.

6. The CAN bus driver of claim 5, wherein a source terminal of the first field effect transistor is coupled to the current source that is configured to provide the first current, is configured to receive the input voltage, and is coupled to the capacitor that is configured to receive the second current, and wherein a source terminal of the second field effect transistor is coupled to a bias voltage.

7. The CAN bus driver of claim 6, wherein the input voltage is a linear ramp voltage and the first translinear loop circuit is configured to map the linear ramp voltage to an exponential current in a drain terminal of the second field effect transistor.

8. The CAN bus driver of claim 1, wherein the first translinear loop circuit comprises a first field effect transistor, a second field effect transistor, a third field effect transistor, a fourth field effect transistor, a fifth field effect transistor, a sixth field effect transistor, a voltage source, and a current source configured to provide a current, wherein a gate terminal of the third field effect transistor is configured to receive the input voltage, and a voltage at a gate terminal of the third field effect transistor is configured to be ramped down by the voltage source, wherein the gate terminal of the third field effect transistor is coupled to a gate terminal of the first field effect transistor, and a drain terminal of the third field effect transistor is coupled to the current source that is configured to provide the current, and wherein a drain current of the first field effect transistor is exponentially related to a voltage swing at the gate terminal of the third field effect transistor, and the drain current of the first field effect transistor is mirrored by the sixth field effect transistor to output the first output current signal.

9. The CAN bus driver of claim 8, wherein the second, fourth, and fifth field effect transistors are source followers.

10. The CAN bus driver of claim 1, wherein the second translinear loop circuit comprises a first field effect transistor, a second field effect transistor, a third field effect transistor, a fourth field effect transistor, a fifth field effect transistor, a sixth field effect transistor, a seventh field effect transistor, an eighth field effect transistor, a ninth field effect transistor, and a first current source configured to provide a first current, wherein a drain terminal of a first field effect transistor is configured to receive the input voltage, to generate a positive drain current of the first field effect transistor, and wherein the drain terminal of the first field effect transistor is coupled to a drain terminal of the second field effect transistor, which results in a negative drain current of the second field effect transistor.

11. The CAN bus driver of claim 10, wherein a gate terminal of the third field effect transistor is coupled to the gate terminal of the second field effect transistor to form a current mirror that is configured to mirror the negative drain current to a drain terminal of the third field effect transistor, and is coupled to a drain terminal of the fourth field effect transistor.

12. The CAN bus driver of claim 11, wherein the second and third field effect transistors are p-type field effect transistors, and the first, fourth, fifth, sixth, seventh, eighth, and ninth field effect transistors are n-type field effect transistors.

13. The CAN bus driver of claim 12, wherein gate terminals of the fourth, fifth, and sixth field effect transistors are configured to receive a bias voltage, and gate terminals of the first, seventh, and eighth field effect transistors are configured to receive the input voltage.

14. The CAN bus driver of claim 13, further comprising:

a second current source configured to supply a second current, which corresponds to drain currents of the fifth field effect transistor and the seventh field effect transistor, and a third current source configured to supply a third current to a drain terminal of the sixth field effect transistor.

15. The CAN bus driver of claim 14, wherein source terminals of the first, fourth, sixth, seventh, and eighth field effect transistors are coupled to ground or common mode via the ninth field effect transistor.

16. The CAN bus driver of claim 1, wherein the second translinear loop circuit comprises a first field effect transistor, a second field effect transistor, a third field effect transistor, a fourth field effect transistor, a fifth field effect transistor, a sixth field effect transistor, a seventh field effect transistor, and an eighth field effect transistor, wherein a gate terminal of the first field effect transistor is coupled to gate terminals of the third and fourth field effect transistors, a gate terminal of the fifth field effect transistor is coupled to a gate terminal of the second field effect transistor and a drain terminal of the sixth field effect transistor, and wherein a gate terminal of the sixth field effect transistor is configured to receive a bias voltage, and is coupled to gate terminals of the seventh and eighth field effect transistors, and a drain terminal of the eighth field effect transistor is coupled to an output to output the second output current signal.

17. The CAN bus driver of claim 1, wherein the divider circuit comprises four bi-polar junction transistors (BJTs).

18. The CAN bus driver of claim 1, wherein the CAN Lo driver circuit comprises a first field effect transistor configured to receive the divided output current signal, second and third field effect transistors configured to receive mirrors of the divided output current signal, and fourth, fifth, sixth and seventh field effect transistors configured to output the divided output current signal to a CAN Lo wire of the CAN bus.

19. The CAN bus driver of claim 18, wherein the CAN Hi driver circuit comprises first and second field effect transistors configured to receive the divided output current signal, and third, fourth, fifth, and sixth field effect transistors configured to amplify and output the divided output current signal to a CAN Hi wire of the CAN bus.

20. A method for driving a Controller Area Network (CAN) bus, the method comprising:

receiving an input voltage and outputting a first output current signal corresponding to an exponential function using a first translinear loop circuit;

receiving the input voltage and outputting a second output current signal corresponding to a hyperbolic function using a second translinear loop circuit;

outputting a divided output current signal corresponding to the first output current signal divided by the second output current signal using a divider circuit;

outputting the divided output current signal to a CAN Lo wire of the CAN bus using a CAN Lo driver circuit; and outputting the divided output current signal to a CAN Hi wire of the CAN bus using a CAN Hi driver circuit.

21. The method of claim 20, wherein the exponential function is $e^x$ and the hyperbolic function is cosh(x).

* * * * *